US007498917B1

(12) United States Patent
Yang

(10) Patent No.: US 7,498,917 B1
(45) Date of Patent: Mar. 3, 2009

(54) ENCAPSULATED TRANSFORMER

(76) Inventor: Kevin Yang, 1225 Via Coronel, Palos Verdes Estates, CA (US) 90274

( * ) Notice: Subject to any disclaimer, the term of this patent is extended or adjusted under 35 U.S.C. 154(b) by 0 days.

(21) Appl. No.: 12/001,126

(22) Filed: Dec. 8, 2007

(51) Int. Cl.
  *H01F 27/02* (2006.01)
  *H01F 27/24* (2006.01)
(52) U.S. Cl. ............... 336/90; 336/192; 336/96; 336/212
(58) Field of Classification Search .......... 336/212, 336/90, 96, 92, 208, 198, 192
   See application file for complete search history.

(56) References Cited

U.S. PATENT DOCUMENTS

| | | | | |
|---|---|---|---|---|
| 4,044,458 A * | 8/1977 | Prince, Jr. | ...... | 29/605 |
| 5,524,334 A * | 6/1996 | Boesel | ...... | 29/605 |
| 5,565,837 A * | 10/1996 | Godek et al. | ...... | 336/232 |
| 5,996,214 A * | 12/1999 | Bell | ...... | 29/605 |
| 6,466,454 B1 * | 10/2002 | Jitaru | ...... | 361/836 |
| 6,583,703 B2 * | 6/2003 | Li | ...... | 336/192 |
| 7,345,566 B2 * | 3/2008 | Urano | ...... | 336/212 |
| 2005/0077615 A1 * | 4/2005 | Yu et al. | ...... | 257/706 |

* cited by examiner

*Primary Examiner*—Anh T Mai
(74) *Attorney, Agent, or Firm*—Clement Cheng

(57) ABSTRACT

A transformer comprises a core formed by laminations, each having a rectangular plate with two spaced windows for receiving a set of coils passing through the windows in turn; a pair of terminal supports made of dielectric material, the supports extending through the core laminations down to the bottom thereof and being terminated by L-shaped brackets for mounting on the surface of the circuit board, the brackets spanning the width of the transformer and carrying two arrays of pins extending from the output transformer for providing connections of the coil ends with other components of the electronic device; a hexahedron mold block of thermoplastic resin with glass fiber for encapsulating the transformer leaving the pins for electrical connections.

17 Claims, 4 Drawing Sheets

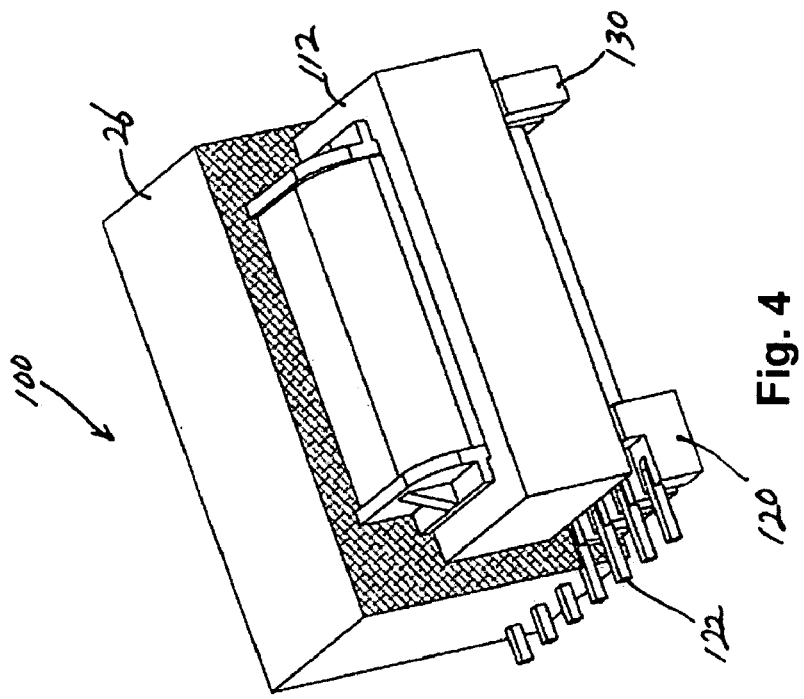
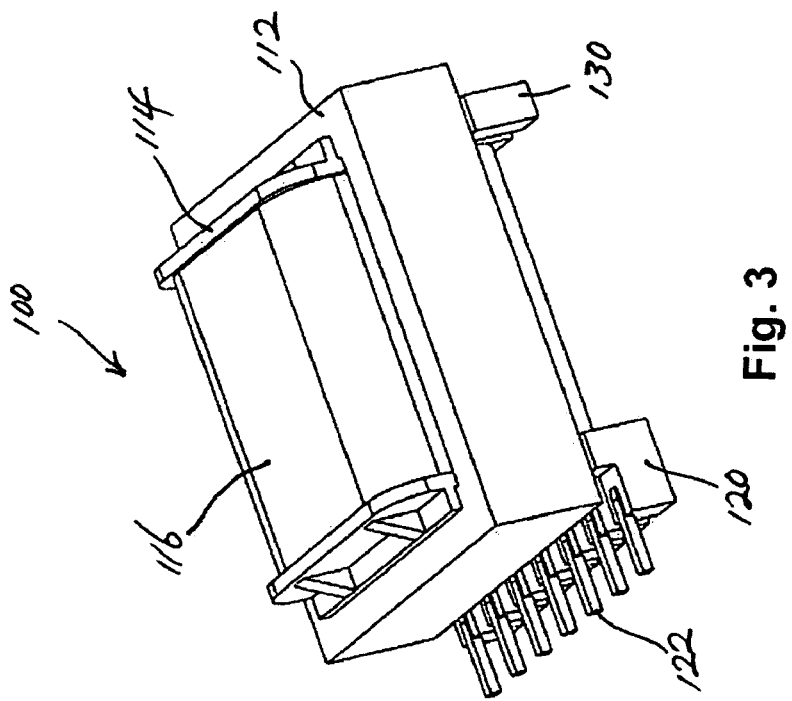

ENCAPSULATED TRANSFORMER

BACKGROUND OF THE INVENTION

A. Field of the Invention

The present invention relates to transformers. More particularly, the present invention relates to a transformer encapsulated in a protective mold of fiberglass embedded resin.

B. Description of the Prior Art

A transformer comprises two or more coupled windings of a wire and a laminated bobbin or core for holding the windings to concentrate magnetic flux. An alternating voltage (AC) applied to one winding creates a time-varying magnetic flux in the core, which induces a voltage in the other windings. Varying the relative number of turns between primary and secondary windings determines the ratio of the input and output voltages, thus transforming the voltage by stepping it up or down between circuits.

The transformer transforms electrical current received from a primary coil side of circuit into a magnetic flux, which is transferred in a different current through the core to a secondary coil side of circuit ideally without any movement between the transformer parts. Its purpose is to change the electricity into a desired value wherein between the change of voltage and the corresponding change of the current ampere the voltage change is mainly used.

When the transformer is used to power in a power circuit, the power transformer is primarily desired to function better for the simple and sophisticated operation of higher end device circuitries. For example, audio devices need signal flowing through a pure and simple path as well as a stable clean DC as in illuminating devices. To this end, transformers use the laminated metal core. Metal cores easily create magnetic flux and increases effectiveness of the transformer. Most metal cores are made from silicon steel sheets for their superior electrical properties in creating the magnetic flux with ease. Also as a measure to reduce Foucault current or Eddie current layers of 0.3 mm thin metal plates form the core. The superimposed surfaces of the metal layers are insulated from each other and carefully bonded together avoiding any gaps to deteriorate efficiency.

Generally, when an electric current flows through a conducting line, certain magnetic field is formed around the conductor. And moving the current on conductor with respect to the magnetic field will induce an electric voltage. Alternating current with the frequency of 60 Hz applied to the transformer primary winding will result in a magnetic field expanding and contracting around the coil winding. Such magnetic field movement induces a voltage across the ends of the secondary coil winding. Induced secondary coil voltage is determined by the winding ratio between the primary and secondary coils. By having various winding ratios desired output voltages might be obtained simultaneously.

Transformers are adapted to have multiple secondary coils for providing various voltages needed by various circuit components. However, transformers themselves inherently have the problem of producing 60 Hz hum to be introduced into circuits around the transformers.

Besides its low cost to manufacture, because transformers in the open type of system have quality issues including emission of noise and unprotected impacts from external forces encapsulation of transformer has been performed using materials and structures with unlimited varieties.

With special consideration on reliable voltage insulation among others, mold-in type transformers currently available generally comprise a dielectric sheet, a first dielectric tape for fastening a core, a second dielectric tape for insulating windings around a bobbin or core and a volatile dipping solution. However, this method of making transformers needs the initial step of aligning the dielectric sheet to make a good fit with the winding bobbin and subsequent steps of securing the core with wraps of the dielectric tape and then another tape for insulating the windings which renders the whole process relatively complex. The final step has been dipping the transformer assembly into a bath of dielectric liquid followed by a curing step wherein the dielectric liquid is a volatile material like a liquid varnish that leaves little ingredients on the transformer product resulting in poor insulation voltage and insulation resistance and thus leaving the coils unprotected from contacting objects that may break the windings.

Different from the tape and varnish approach, potting consists of placing components in a potting cup then pouring a potting compound into the vessel. This compound may be either air- or oven-cured depending upon the type of material used. This manufacturing process traditionally has offered superior levels of thermal conductivity and corona resistance. Still, potting tends to be very labor and time intensive.

However, manufacturing transformers can be more simplified taking advantage of newly introduced thermoplastics. The three dimensional moldability of thermoplastics offers ways to add additional functionality into the part without adding extra components or manufacturing steps. No harmful volatile organic compounds (VOCs) are released as they are with many potting compounds. In addition, the process has a faster cycle time because thermoplastics eliminate several steps. A potting cup is no longer needed as with the insertion of the delicate components into the cup, and the labor-intensive potting operation or the oven-curing step. While potting cure times can last from one hour to days, thermoplastic encapsulation cycle times are generally from ten to sixty seconds that is a dramatic reduction. Thermoplastics generally perform better in thermal cycle, have a smaller size and lighter weight, and are more durable.

Encapsulation with standard thermoplastics on transformers typically leads to hot spot temperature reductions relative to open structures, due to the inherent thermal transfer advantages of conduction relative to convection. Use of a thermally conductive plastic can provide even greater thermal benefits. Key to this behavior is the intimate contact with the windings enabled by encapsulation. For reference, air has a low thermal conductivity of approximately 0.01 W/mK, and standard thermoplastics are 0.1 to 0.35 W/mK. Thermally conductive polymers can be as high as from 0.5 W/mK to 50 W/mK.

Subsequent benefits of providing a good thermal conductivity include reduced component sizes, faster electrical response times and longer component life. Thermoplastic encapsulation of transformers enables the design of a system with improved acoustic and vibratory characteristics. Thermoplastic encapsulation tends to dampen transformer vibration. Thermoplastic components are more rugged and pass higher voltage withstand tests so they are safer in operation. With encapsulation, a newly unified structure is produced where its resonant frequencies can be controlled and shifted using a proprietary process control technology and by the tailoring of the encapsulant stiffness and loss factor properties. Depending on the specific system requirements, encapsulant properties are modified to develop polymers ranging from ultra stiff composites to flexible thermoplastic elastomers. An encapsulating composition comprises a glass reinforced resin or a liquid crystal polymer. Injection molding to encapsulate transformers provides significant advantages in attenuation of noise and vibration and an ability to shift the frequencies of peak amplitude.

Also, in an electric device like ballast, the transformer is normally enclosed in a metal housing with a too tight space to dissipate heat, which is not only a waste of the electric energy but also a cause to shorten the life of the transformer resulting in early failure of the surrounding circuits in the same housing. Such conventional configurations do not allow ready dissipation of heat due to lack of space in the compact housing and confinement of the transformer by the surrounding components.

To solve this problem, the present invention provides a universal transformer geometry that may be applied to wide varieties of available materials in order to maximize a transformer performance against harmful heat and noise.

SUMMARY OF THE INVENTION

The general object of the present invention is to provide a shielded enclosure for a transformer through a molding process to improve moisture-resistance, insulation with respect to the surrounding components and between the primary and secondary windings and the strength of the shielding walls formed.

The secondary object of the present invention is to provide an effective transformer enclosure to block undesirable electromagnetic radiation or conduction from entering or exiting the enclosure.

The enclosed transformer of the present invention is excellent for mounting on a compact circuit board where a plurality of electrical components, such as connectors, transistors, diodes, and the like are closely positioned with minimal clearance among them.

The present invention is an improvement to conventional enclosed transformer for electronic devices. The transformer comprises a core formed by laminations, each having a rectangular plate with two spaced windows for receiving a set of coils passing through the windows in turn; a pair of terminal supports made of dielectric material, the supports extending through the core laminations down to the bottom thereof and being terminated by L-shaped brackets for surface mounting on the surface of the circuit board, the brackets spanning the width of the transformer and carrying two arrays of pins extending from the output transformer for providing connections of the coil ends with other components of the electronic device; a hexahedron mold block of thermoplastic resin with glass fiber for encapsulating the transformer leaving the pins for electrical connections and at least four legs protruding downwardly of the transformer at corresponding thru-holes of the circuit board and fixed thereto by soldering as with other components.

In another embodiment of the present invention, the transformer has one sided terminal support for mounting on the printed circuit board at its edge away from the rest of the electronic components and the terminal support comes to hug the circuit board at its top surface and a side wall area and fixed thereto in a cantilevered mounting with an array of pins from the transformer make direct contact with the trace of the circuit board, whereby dissipation of heat from the operating transformer is less hindered by other components but expedited through the compact housing in closer proximity.

The objects, features, and advantages of the present invention are readily apparent from the following detailed description of the best mode for carrying out the invention when taken in connection with the accompanying drawings.

BRIEF DESCRIPTION OF THE DRAWINGS

FIG. 3 is a perspective view of a second embodiment of the transformer of the present invention with a single line of terminals before an encapsulation.

FIG. 4 is a partially exploded perspective view of the transformer of FIG. 3 after encapsulation.

DETAILED DESCRIPTION OF THE PREFERRED EMBODIMENT

Figure 1:
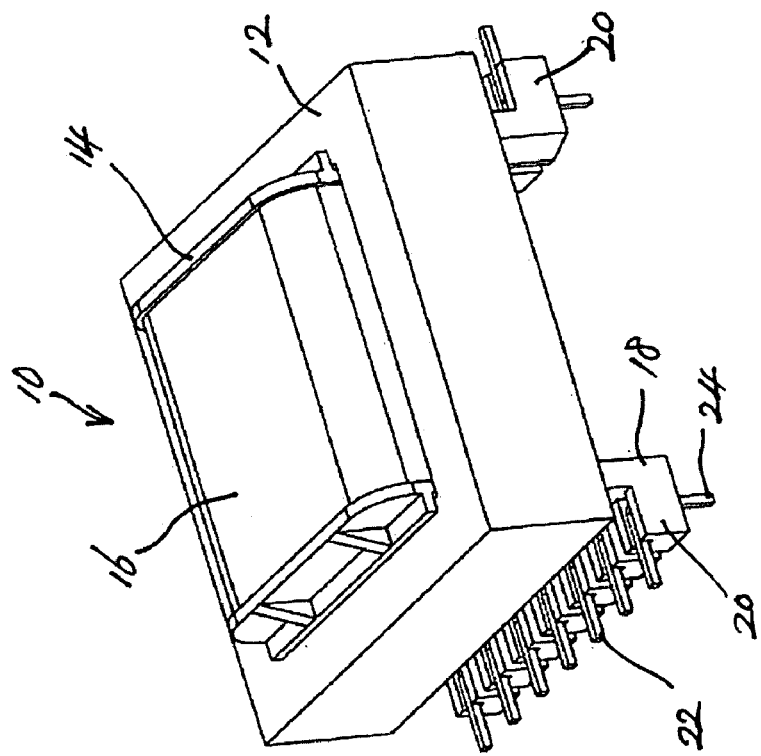
FIG. 1 is a perspective view showing a dual in line package type transformer assembly for molding in accordance with a first embodiment of the present invention.

Referring to FIG. 1, a transformer 10 of the present invention is for use at power or audio frequencies and typically has a core 12 made of high permeability silicon steel. Although the exterior of the core 12 is shown as flatly rectangular at all four longitudinal sides, can either be made of multiple thin steel layers stacked alternately with dielectric layers in a longitudinal direction or can be made of one or more blocks or sections of ferrite core material. The ferrite core material can be made by ceramic production methods. When the transformer is used to power in a power circuit, the power transformer is primarily desired to function better for the simple and sophisticated operation of higher end device circuitries. For example, audio devices need signal flowing through a pure and simple path as well as a stable clean DC as in illuminating devices. To this end, transformers use the laminated metal core. Metal cores easily create magnetic flux and increases effectiveness of the transformer. Most metal cores are made from silicon steel sheets for their superior electrical properties in creating the magnetic flux with ease. Also as a measure to reduce Foucault current or Eddie current layers of 0.3 mm thin metal plates form the core 12. The superimposed surfaces of the metal layers are insulated from each other and carefully bonded together avoiding any gaps to deteriorate efficiency.

For simplicity, the individual lines to depict the multiple sheets were omitted from the drawings. Latitudinally, the transformer 10 may be divided at a straight middle line by two E shaped cutouts joined facing opposite to each other leaving two rectangular through holes in the transformer 10. A bobbin 14 shaped as H is positioned in the two rectangular holes not shown.

Like most small power transformers, the transformer 10 is shell-type, in which the iron core 12 surrounds copper wires 16, which have been wound about the bobbin 14. The ideal would be for the core iron to completely surround the windings, although this is impractical. The compromise is to divide the magnetic circuit into two return paths on opposite sides of the core, as may be done with E and E laminations. As to the lamination pattern, the common E and I shapes may be also employed. So, the core 12 may have a parting line (not shown) through the thickness at its middle or one of the lateral sides near the bracket 20.

As the E and E laminations are bonded together, the core 12 is tightly held by the plastic bobbin 14 holding the windings 16. Alternatively, the core 12 can also be made of one or more sections of ferrite core material similarly bonded together and tightly held by the plastic bobbin 14 holding the windings 16. The laminations are glued together by the insulating substance or the ferrite core material is glued or taped or otherwise adhered together. The windings on this transformer are wound one over the other, the primary winding may be first wound on the bobbin followed by the secondary winding on top of the primary winding maintaining electrical isolation at each and every turns of the copper wires. The ends of the wires 16 are soldered to multiple terminal pins 24. The turns of the windings 16 must be insulated from each other to ensure that the current travels through the entire winding. The potential difference between adjacent turns is usually small, so that enamel insulation may suffice for small power transformers. Supplemental sheet or tape insulation usually employed between winding layers may be omitted thanks to the subsequent encapsulation over the optimal contour of the transformer 10 for encapsulation.

The present invention is an improvement to conventional enclosed transformer for mounting on electronic circuit boards. The bobbin 14 of the transformer 10 also comprises a pair of terminal supports 18 made of a dielectric material, the supports 18 extending throughout the core laminations and being terminated by L-shaped brackets 20 for surface mounting on the surface of the circuit board. The brackets 20 span the width of the transformer and carry at least one array of terminal pins 22 extending from the output transformer 10 for providing connections of the coil ends with other components of the electronic device.

The transformer is completely sealed against moisture ingress. Thus the encapsulant serves as a cooling medium to remove heat from the core and coil. By impregnating the transformer with encapsulant resin, air spaces within the windings are replaced with the resin, thereby sealing the windings and helping to prevent the possible formation of corona and absorption of dirt or water. This produces transformers suitable for damp or dusty environments.

Figure 2:
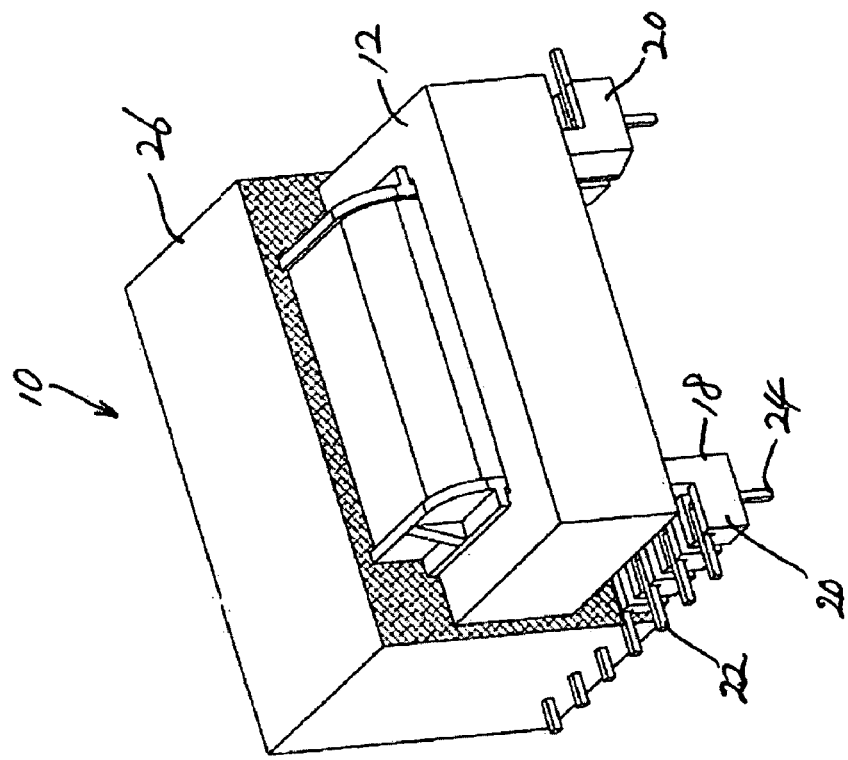
FIG. 2 is a partially exploded perspective view of the transformer of FIG. 1 enclosed.

In FIG. 2, a hexahedral mold block 26 of thermoplastic resin with glass fiber encapsulates the transformer 10 by injection molding leaving the pins 24 for electrical connections and at least four pins 24 protruding downwardly of the transformer 10 at corresponding thru-holes of the circuit board and fixed thereto by soldering as with other components.

The encapsulated transformer 10 comprises two or more coupled windings 16 of a wire and laminated bobbin 14 in the core 12 for holding the windings 16 to concentrate magnetic flux. An alternating voltage (AC) applied to one winding creates a time-varying magnetic flux in the core 12, which induces a voltage in the other windings. Varying the relative number of turns between primary and secondary windings determines the ratio of the input and output voltages, thus transforming the voltage by stepping it up or down between circuits.

The transformer transforms electrical current received from a primary coil side of circuit into a magnetic flux, which is transferred through the core to a secondary coil side of circuit ideally without any movement between the transformer parts. Its purpose is to change the electricity into a desired value wherein between the change of voltage and the corresponding change of the current ampere the voltage change is mainly used.

Transformers are adapted to have multiple secondary coils for providing various voltages needed by various circuit components. Both the primary and secondary windings on the transformer 10 may have external connections, called taps, to intermediate points on the winding to allow selection of the voltage ratio. The taps may be connected to an automatic, on-load tap changer for voltage regulation of distribution circuits. Audio-frequency transformers, used for the distribution of audio to public address loudspeakers, have taps to allow adjustment of impedance to each speaker. A center-tapped transformer is often used in the output stage of an audio power amplifier in a push-pull circuit. Besides its low cost to manufacture, because transformers in the open type of system have quality issues including emission of noise and unprotected impacts from external forces encapsulation of transformer has been performed using materials and structures with unlimited varieties.

With special consideration on reliable voltage insulation among others, mold-in type transformers currently available generally comprise a dielectric sheet, a first dielectric tape for fastening a core, a second dielectric tape for insulating windings around a bobbin or core and a volatile dipping solution. However, this method of making transformers needs the initial step of aligning the dielectric sheet to make a good fit with the winding bobbin and subsequent steps of securing the core with wraps of the dielectric tape and then another tape for insulating the windings which renders the whole process relatively complex. The final step has been dipping the transformer assembly into a bath of dielectric liquid followed by a curing step wherein the dielectric liquid is a volatile material like a liquid varnish that leaves little ingredients on the transformer product resulting in poor insulation voltage and insulation resistance and thus leaving the coils unprotected from contacting objects that may break the windings.

Different from the tape and varnish approach, potting consists of placing components in a potting cup then pouring a potting compound into the vessel. This compound may be either air- or oven-cured depending upon the type of material used. This manufacturing process traditionally has offered superior levels of thermal conductivity and corona resistance. Still, potting tends to be very labor and time intensive.

However, manufacturing transformers can be more simplified taking advantage of newly introduced thermoplastics as applied to the simplified profile of the present transformer. The three dimensional moldability of thermoplastics offers ways to add additional functionality into the part without adding extra components or manufacturing steps. No harmful volatile organic compounds (VOCs) are released as they are with many potting compounds. In addition, the process has a faster cycle time because thermoplastics eliminate several steps. A potting cup is no longer needed as with the insertion of the delicate components into the cup, and the labor-intensive potting operation or the oven-curing step. While potting cure times can last from an hour to days, thermoplastic encapsulation cycle times can be generally from ten to sixty seconds that is a dramatic reduction. Thermoplastics generally perform better in thermal cycle, have a smaller size and lighter weight, and are more durable.

Encapsulation with standard thermoplastics on transformers typically leads to hot spot temperature reductions relative to open structures, due to the inherent thermal transfer advantages of conduction relative to convection. Use of a thermally conductive plastic can provide even greater thermal benefits. Key to this behavior is the intimate contact with the windings enabled by encapsulation. For reference, air has a low thermal conductivity of approximately 0.01 W/mK, and standard thermoplastics are 0.1 to 0.35 W/mK. Thermally conductive polymers can be as high as from 0.5 W/mK to 50 W/mK.

Subsequent benefits of providing a good thermal conductivity include reduced component sizes, faster electrical response times and longer component life. Thermoplastic encapsulation of transformers enables the design of a system with improved acoustic and vibratory characteristics. Thermoplastic encapsulation tends to dampen transformer vibration. Thermoplastic components are more rugged and pass higher voltage withstand tests so they are safer in operation. With encapsulation, a newly unified structure is produced where its resonant frequencies can be controlled and shifted using a proprietary process control technology and by the tailoring of the encapsulant stiffness and loss factor properties. Depending on the specific system requirements, encapsulant properties are modified to develop polymers ranging from ultra stiff composites to flexible thermoplastic elastomers.

In comparison, FIGS. 3 and 4 show new transformer 100 having all the equivalent components of transformer 10 but adapted to a different circuit board, which can be relatively shorter. The transformer 100 comprises core 112, coil 116 and a single terminal support 120 at one side of the transformer 100. The terminal support 120 becomes a bracket through which an array of pins 122 protrudes from the transformer 100. The other terminal support 130 extends in the same direction as that of the support 120 but terminates short at a straight end.

Figure 5:
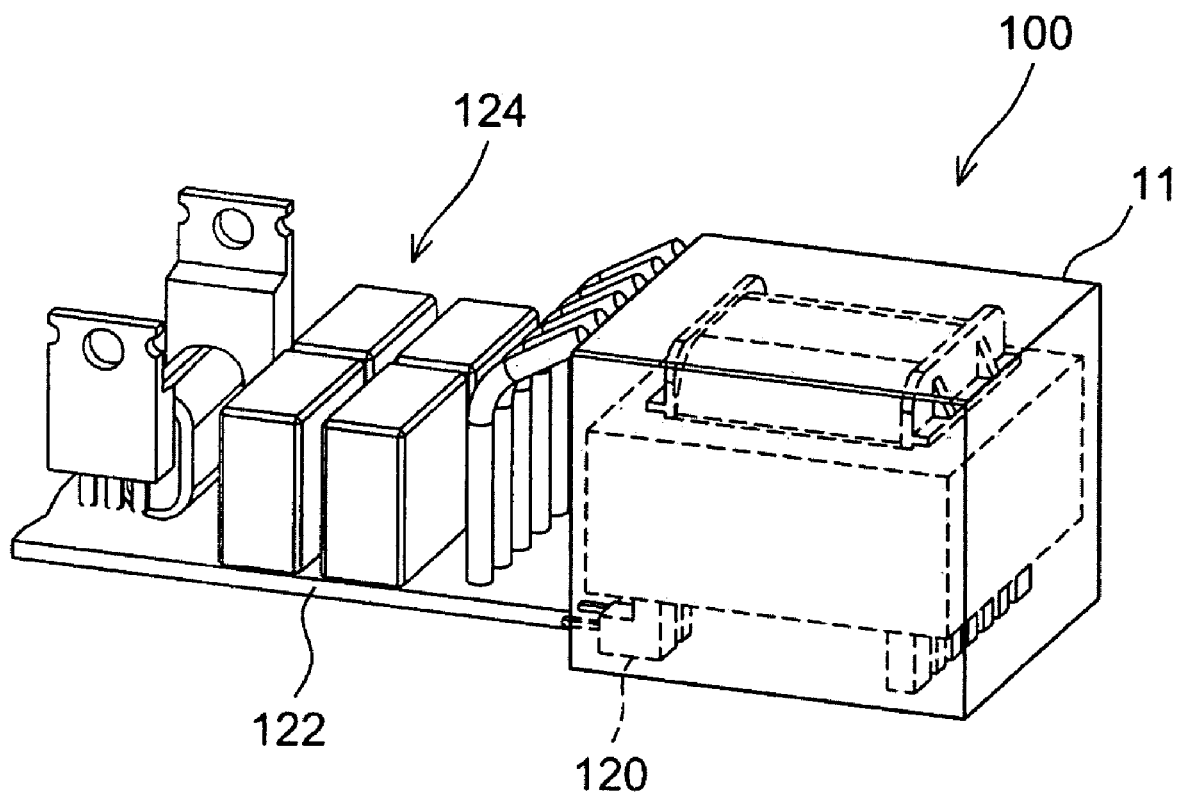
FIG. 5 is a perspective view of the transformer of FIG. 4 mounted at an edge of a ballast circuit board.

Referring to FIG. 5, the transformer 100 may be mounted at an edge of ballast or other circuit board 122 whereby the overall size of the circuit board is reduced. The printed trace of circuit may be designed at the bottom area of the board 122 near the edge so that it maintains the functional connections with the components 124. This edgewise mounting of the transformer 100 allows more intimate connections between the transformer 100 and the circuit board 122. The L-shaped bracket 120 hugs an output side edge of the circuit board instead of being surface mounted as with the transformer 10 of FIG. 1. The thus cantilevered transformer 100 is located near an end wall of the circuit board and physically distanced from the rest of the board 122 so that heat from the output transformer 100 can be dissipated faster through its encapsulation of FIG. 4 in conjunction with the atmosphere and thereby prolong the life of the circuit board 122 according to the present invention. As described above, transformers may now be encapsulated without the laborous conventional methods and time to manufacture.

The a pair of "E-shaped" ferrite core material is typically oriented so that they form a plane of orientation parallel to the board. The horizontal configuration contrasts with a vertical orientation not shown in FIG. 1. The vertical orientation is where the ferrite core material is oriented so that there is a plane of orientation perpendicular to the board.

Figure 6B:
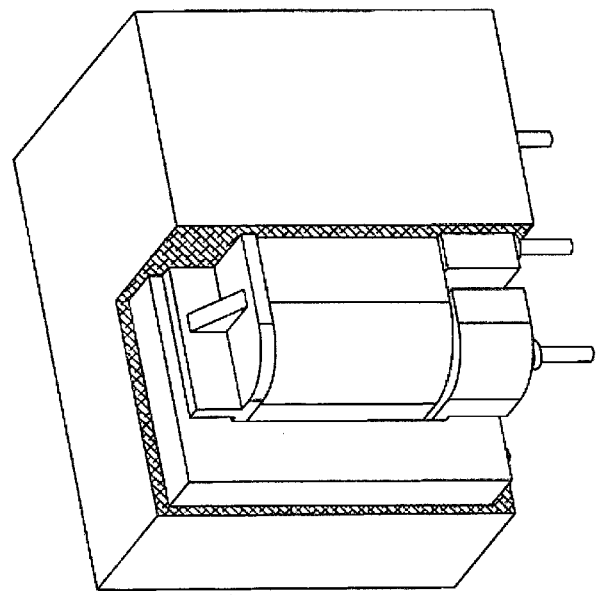
FIG. 6*b* is a perspective view of the transformer that has a vertical core orientation as opposed to the horizontal core orientation shown in FIGS. 1 through 5. Similar reference numbers denote corresponding features throughout the attached drawings.
Figure 6A:
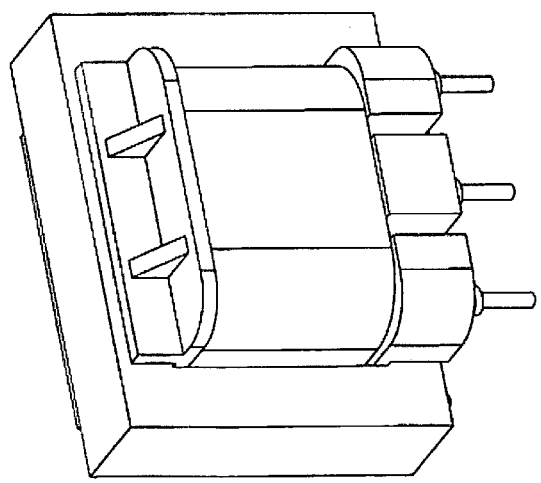
FIG. 6*a* is a perspective view of the transformer that has a vertical core orientation as opposed to the horizontal core orientation shown in FIGS. 1 through 5.

The transformer can also have a vertically oriented core as shown in FIG. 6a which is encapsulated as shown in FIG. 6b. The vertically oriented core is contrasted with the horizontally oriented core of FIG. 3, FIG. 4.

Therefore, while the presently preferred form of transformer has been shown and described, it is to be understood that the present invention is not limited to the sole embodiment describe above, but encompasses any and all embodiments within the scope of the following claims.

The invention claimed is:

1. A transformer for mounting on a top surface of an electronic circuit board having multiple components and printed at its bottom surface with traces of circuit, wherein the transformer comprises a core formed from portions of ferrite core material, each portion of ferrite core material adapted and shaped for receiving coils passing around the core; a pair of terminal supports made of dielectric material extending through the core laminations and terminated by L-shaped brackets mounted on the surface of the circuit board, the brackets spanning the width of the transformer and carrying an array of pins extending from the output transformer for providing connections with the circuit board by soldering as with other components, an improvement comprising: an injected thermoplastic block for completely surrounding the transformer leaving the array of connecting pins, whereby dissipation of heat from the operating transformer is less interfered by other components but expedited through the thermoplastic block as well as the atmosphere, wherein the terminal supports of the transformer having one of its L-shaped brackets hug the circuit board at its top surface and a side wall area and fixed thereto in a cantilevered mounting with an array of the pins from the transformer making direct contact with the trace of the circuit board.

2. The transformer of claim 1, wherein the thermoplastic block comprises a thermally conductive plastic.

3. The transformer for of claim 2, wherein the thermally conductive plastic comprises fiberglass embedded resin.

4. The transformer of claim 1, wherein the terminal connecting pins are directly soldered to the bottom surface of the printed circuit board for providing connections with the plurality of electronic components.

5. The transformer of claim 1, wherein the printed circuit board has its circuit trace configured to locate the transformer hung from an edge of the printed circuit board.

6. An encapsulated transformer at an output side of a circuit board for connection with a number of electronic components mounted on a top surface of the circuit board comprising:
   a. a pair of "E-shaped" ferrite core material joined to form two closed windows;
   b. a dielectric bobbin threading the windows;
   c. coils wound over the bobbin passing through the windows in turn to form primary and secondary windings, each of the coil ends having connection pins soldered thereto;
   d. a pair of terminal supports made of dielectric material, the supports extending from the opposite ends of the bobbin through the core laminations down to the bottom thereof and being terminated by L-shaped brackets mounted on the surface of the circuit board;
   e. the printed circuit board having its circuit trace configured to relocate the transformer to an edge of the circuit board away from the rest of the electronic components and
   f. the terminal supports of the transformer having one of its L-shaped brackets hug the circuit board at its top surface and a side wall area and fixed thereto in a cantilevered mounting with an array of the pins from the transformer making direct contact with the trace of the circuit board.

7. The encapsulated transformer of claim 6, wherein the transformer has, on a side, terminal connecting pins directly soldered to the back surface of the printed circuit board for providing connections with the plurality of electronic components.

8. The encapsulated transformer of claim 6, wherein an injected thermoplastic resin with glass fiber forms a hexahedron mold block defining the exterior of the transformer, one side of the transformer being connected with the printed circuit board end and the five other sides of the transformer being hung in the atmosphere.

9. The encapsulated transformer of claim 6, wherein the pair of ferrite cores are vertically oriented in relation to the printed circuit board.

10. The encapsulated transformer of claim 9, wherein the transformer has, on a side, terminal connecting pins directly soldered to the back surface of the printed circuit board for providing connections with the plurality of electronic components.

11. The encapsulated transformer of claim 9, wherein an injected thermoplastic resin with glass fiber forms a hexahedron mold block defining the exterior of the transformer, one side of the transformer being connected with the printed circuit board end and the five other sides of the transformer being hung in the atmosphere.

12. An encapsulated transformer at an output side of a circuit board for connection with a number of electronic components mounted on atop surface of the circuit board comprising:
   a. a pair of ferrite cores joined to form two closed windows;
   b. a dielectric bobbin threading the windows;
   c. coils wound over the bobbin passing through the windows in turn to form primary and secondary windings, each of the coil ends having connection pins soldered thereto;
   d. a pair of terminal supports made of dielectric material, the supports extending from the opposite ends of the bobbin through the core laminations down to the bottom thereof and being terminated by L-shaped brackets mounted on the surface of the circuit board;
   e. the printed circuit board having its circuit trace configured to relocate the transformer to an edge of the circuit board away from the rest of the electronic components and the terminal supports of the transformer having one of its L-shaped brackets hug the circuit board at its top surface and a side wall area and fixed thereto in a cantilevered mounting with an array of the pins from the transformer making direct contact with the trace of the circuit board.

13. The encapsulated transformer of claim 12, wherein the transformer has, on a side, terminal connecting pins directly soldered to the back surface of the printed circuit board for providing connections with the plurality of electronic components.

14. The encapsulated transformer of claim 12, wherein an injected thermoplastic resin with glass fiber forms a hexahedron mold block defining the exterior of the transformer, one side of the transformer being connected with the printed circuit board end and the five other sides of the transformer being hung in the atmosphere.

15. The encapsulated transformer of claim 12, wherein the pair of ferrite cores are vertically oriented in relation to the printed circuit board.

16. The encapsulated transformer of claim 15, wherein the transformer has, on a side, terminal connecting pins directly soldered to the back surface of the printed circuit board for providing connections with the plurality of electronic components.

17. The encapsulated transformer of claim 15, wherein an injected thermoplastic resin with glass fiber forms a hexahedron mold block defining the exterior of the transformer, one side of the transformer being connected with the printed circuit board end and the five other sides of the transformer being hung in the atmosphere.

* * * * *